(12) United States Patent
Phillips et al.

(10) Patent No.: US 6,187,089 B1
(45) Date of Patent: Feb. 13, 2001

(54) TUNGSTEN DOPED CRUCIBLE AND METHOD FOR PREPARING SAME

(75) Inventors: Richard Joseph Phillips, St. Peters; Steven Jack Keltner, O'Fallon, both of MO (US)

(73) Assignee: MEMC Electronic Materials, Inc., St. Peters, MO (US)

( * ) Notice: Under 35 U.S.C. 154(b), the term of this patent shall be extended for 0 days.

(21) Appl. No.: 09/245,238

(22) Filed: Feb. 5, 1999

(51) Int. Cl.⁷ .................................................. C30B 15/10
(52) U.S. Cl. .................. 117/13; 117/2; 117/3; 117/208; 117/900; 117/932; 65/446
(58) Field of Search ................... 117/900, 932, 117/208, 13, 2, 3; 65/446

(56) References Cited

U.S. PATENT DOCUMENTS

| | | | |
|---|---|---|---|
| 4,505,948 | * 3/1985 | Pinkhasov | 118/723 |
| 5,174,801 | 12/1992 | Matsumura et al. | 65/18.1 |
| 5,308,446 | * 5/1994 | Bihuniak et al. | 117/200 |
| 5,720,809 | * 2/1998 | Iino et al. | 117/200 |
| 5,730,800 | 3/1998 | Sato et al. | 118/200 |
| 5,919,306 | * 7/1999 | Takemura | 117/200 |
| 5,997,640 | * 12/1999 | Berthold et al. | 117/200 |

FOREIGN PATENT DOCUMENTS

| | | | |
|---|---|---|---|
| 8-169798 | 7/1996 | (JP) | C30B/29/06 |
| 8-217592 | 8/1996 | (JP) | C30B/15/10 |
| 8-239231 | 9/1996 | (JP) | C03B/20/00 |
| 8-333124 | 12/1996 | (JP) | C03B/20/00 |
| WO 98/48085 | 10/1998 | (WO) | |

OTHER PUBLICATIONS

Shackelford, et al., "The Thermodynamics of Water and Hydrogen Solubility in Fused Silica", Journal of Non–Crystalline Solids, 21 (1976) 55–64.

Flores, et al., "The Solubility of Argon in Vitreous Silica", Journal of Non–Crystalline Solids, 68 (1984) 327–332.

Schroeder, et al., "Nitrogen Doping of Fused Silica and Silicate Glasses: A Study of Transport and Optical Properties", Journal of Non–Crystalline Solids, 102 (1988) 181–195.

Shackelford, et al., "Solubility of Gases in Glass. II. He, Ne, and H2 in Fused Silica", Journal of Applied Physics, (1972) 43–44.

Patent Abstract of Japanese Publication No. 58115088 (1983).

PCT International Search Report.

* cited by examiner

Primary Examiner—Robert Kunemund
(74) Attorney, Agent, or Firm—Senniger, Powers, Leavitt & Roedel

(57) ABSTRACT

A process for preparing a quartz crucible having a tungsten doped layer on the inside surface, outside surface, or both the inside surface and the outside surface is disclosed. One or more surfaces of the crucible is exposed to a vaporous tungsten source to anneal the tungsten into the crucible surface and create a tungsten doped layer which behaves similarly to a bubble free layer upon use in a crystal pulling process.

37 Claims, 3 Drawing Sheets

TUNGSTEN DOPED CRUCIBLE AND METHOD FOR PREPARING SAME

BACKGROUND OF THE INVENTION

The present invention relates to a tungsten doped crucible and a process for preparing a tungsten doped crucible. More particularly, the present invention relates to a process for doping the inside surface, the outside surface, or both the inside and outside surfaces of a quartz crucible with tungsten to produce a layer which behaves similarly to a bubble free layer upon use in a crystal growing process.

In the production of single silicon crystals grown by the Czochralski method, polycrystalline silicon is first melted within a quartz crucible. After the polycrystalline silicon has melted and the temperature equilibrated, a seed crystal is dipped into the melt and subsequently extracted to form a single crystal silicon ingot while the quartz crucible is rotated. Due to the extremely high temperatures achieved during ingot growth, the quartz crucible is slowly dissolved at the crucible-melt interface as the ingot is grown.

Because of the extreme conditions encountered during ingot growth, high quality quartz glass is an indispensable crucible material in semiconductor technology because of its purity, temperature stability and chemical resistance. Currently, most crucibles utilized in the Czochralski process are produced using a mined quartz sand source. Several different grades of mined quartz are available, with differing alkali purity levels and particle sizes. Regardless of grade, however, these raw materials contain gas formers or precursors in two forms. First, gas can be adsorbed on the surface of the quartz sand. This type of former is generally referred to as a "bubble former" as the adsorbed gas may leave the grain surface at elevated temperatures and coalesce to form large sized bubbles. The second type of gas formers are gases which are soluble within the sand grain itself. Again, at elevated temperatures the solubilized gas can coalesce and form bubbles. Examples of adsorbed and soluble gases in quartz sand include nitrogen, argon, oxygen or other organic type gases. These gas formers, along with bubbles that naturally exist in a fused quartz crucible, can lead to numerous problems in the crystal growing process and result in ingot defects.

Upon use of a quartz crucible in a crystal growing process, gas formers located in the silica matrix at and below the inside crucible surface can coalesce and lead to nucleation and/or growth of bubbles on the crucible surface leading to a reduction in the usable thermal life of the crucible. This bubble nucleation and/or growth on the inside surface of the crucible can lead to formation of pits on the quartz surface, which in turn can lead to the generation of particulates which can also enter the melt and result in the loss of perfect structure of the growing ingot. Crucibles typically used in the ingot growing process may contain about 20 pits/cm$^2$ on the surface, with each pit measuring approximately 100 to about 400 micrometers in diameter. Also, the bubbles formed can themselves become entrained at the silicon melt-crystal interface, become part of the growing crystal, and result in a void defect in the crystal.

To increase the functionality of quartz crucibles used in a crystal growing process, crucibles used in the Czochralski growth of single crystal ingots typically have two distinct layers. The outer layer in contact with graphite susceptors supporting the crucible contains a high density of bubbles to regulate radiant energy transfer to the melt and growing ingot. The inner layer of the crucible in contact with the silicon melt contains a reduced bubble layer commonly referred to in the art as a "bubble free layer" or "clear layer." This bubble free layer is not completely bubble free, and upon exposure to temperatures typical in the crystal growth process, can degrade through the nucleation and/or growth of bubbles, resulting in a limited lifetime of the crucible and possible degradation of the quality of the growing ingot.

Recently, numerous attempts have been made in the art to produce a bubble free layer substantially free from bubbles on the inside surface of the crucible. Although some improvements have been made in the thermal stability of the inner layer relative to the production of bubbles, bubbles continue to nucleate and/or grow during ingot growth as the processes employed to date have failed to remove all the gases adsorbed on, or soluble within, the quartz grains comprising the crucible. Therefore, a need remains in the art for a quartz crucible having a substantially bubble free layer on the inner surface such that bubble nucleation and/or growth is reduced or eliminated such that ingot degradation does not occur. Also, a need exists in the industry for a quartz crucible having a substantially bubble free layer on the outer surface such that improved chemical stability of the crucible is realized during contact with graphite susceptors during ingot growth.

SUMMARY OF THE INVENTION

Among the objects of the present invention, therefore, are the provision of a process for producing a quartz crucible having a tungsten doped layer on the inside surface; the provision of a process for producing a quartz crucible having a tungsten doped layer on the outside surface; the provision of a process for producing a quartz crucible having tungsten doped layers on both the inside and outside surfaces; the provision of a process for producing a quartz crucible having improved thermal stability relating to the nucleation and/or growth of bubbles; and the provision of a crucible having a reduced reactivity with graphite components.

Briefly, therefore, the present invention is directed to a process for preparing a quartz crucible having a tungsten doped layer. The process comprises depositing tungsten on a surface of the crucible and diffusing the tungsten in an environment substantially free from oxygen into the crucible surface.

The present invention is further directed to a process for preparing a quartz crucible having two tungsten doped layers. The process comprises depositing tungsten on both the inside and outside surfaces of the crucible and annealing the tungsten into the surfaces in an environment substantially free from oxygen.

The invention is further directed to a process for preparing a quartz crucible having a tungsten doped layer on an inside surface. The process comprises energizing a tungsten source in an environment substantially free from oxygen to heat the source and produce a tungsten vapor. The environment where the tungsten source is heated is defined by the interior of the crucible. The inside surface is exposed to the tungsten vapor to allow tungsten to diffuse into the inside surface and create a tungsten doped layer.

The invention is further directed to a process for preparing a quartz crucible having a tungsten doped layer. The process comprises applying a layer of a tungsten-containing compound to a surface of a crucible and allowing it to dry. A layer of silica is then applied over the coating and the crucible is annealed at a temperature of between about 550° C. and about 900° C. to interdiffuse the compound and silica layer and create a layer containing at least about 100 ppba of tungsten in the crucible.

The invention is further directed to a process for preparing a quartz crucible having a tungsten doped layer. The process comprises mixing a tungsten-containing compound and a silica-containing gel and applying the mixture to a surface of the crucible and allowing it to dry. The crucible is then annealed at a temperature of between about 550° C. and about 900° C. to create a layer having at least about 100 ppba of tungsten in the crucible.

The invention is further directed to a crucible having a tungsten doped layer on an inside surface. The tungsten doped layer has a thickness of between 0.1 millimeter and 4 millimeters and contains no less than about 100 ppba tungsten.

The present invention is further directed to a crucible having a tungsten doped layer on an outside surface. The tungsten doped layer has a thickness of between about 0.1 millimeter and about 6 millimeters and contains no less than about 100 ppba tungsten.

The present invention is further directed to a crucible having tungsten doped layers on both the inside and outside surfaces. The tungsten doped layer on the inside surface has a thickness of between about 0.1 millimeter and about 4 millimeters and the tungsten doped layer on the outside surface has a thickness of between about 0.1 millimeter and about 6 millimeters. Both tungsten doped layers contain no less than about 100 ppba tungsten.

The present invention is further directed to a crucible containing a tungsten dopant. The dopant is distributed between the inside surface and a central plane in the crucible such that the density of the dopant decreases from the inside surface toward the central plane to create a region between about 0.1 and about 4 millimeters thick having a tungsten concentration of at least 100 ppba. Also, the tungsten dopant is distributed between the outside surface and the central plane such that the tungsten dopant density decreases from the outside surface toward the central plane to create a region between about 0.1 and about 6 millimeters thick having a tungsten concentration of at least 100 ppba.

The present invention is further directed to an apparatus for diffusing tungsten into a surface of a quartz crucible to create a tungsten doped layer. The apparatus comprises a horizontal support for supporting the crucible, a tungsten source extending through the support and into the interior of the supported crucible, a power source for energizing and heating the tungsten source to produce a heated tungsten vapor, a gas inlet located in the horizontal support positioned to introduce a purging gas into the supported crucible, and a gas outlet located in the support position to remove purging gas from the interior of the crucible.

Other objects and features of this invention will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

In accordance with the present invention, it has been discovered that by diffusing a low amount of tungsten dopant at an elevated temperature into a surface of a quartz crucible, crucibles can be made having tungsten doped layers on the inside surface, outside surface, or both the inside and outside surfaces that behave similarly to bubble free layers during use in a crystal growing process. Surprisingly, the tungsten dopant in the quartz matrix causes bubbles in the treated surface of the quartz crucible to collapse and not reform during subsequent thermal use without the out-diffusing of tungsten from the crucible surface or the contamination of the growing ingot which can result in the loss of zero dislocation growth and/or a reduction of crystal quality. The collapse of the bubbles keeps particulates and bubbles from entering the melt from the inside surface and causing defects to form in the growing ingot. Also, the collapse of bubbles on the outside surface may increase the mechanical strength of the crucible and decrease unwanted reactions with the graphite supports.

Figure 1:
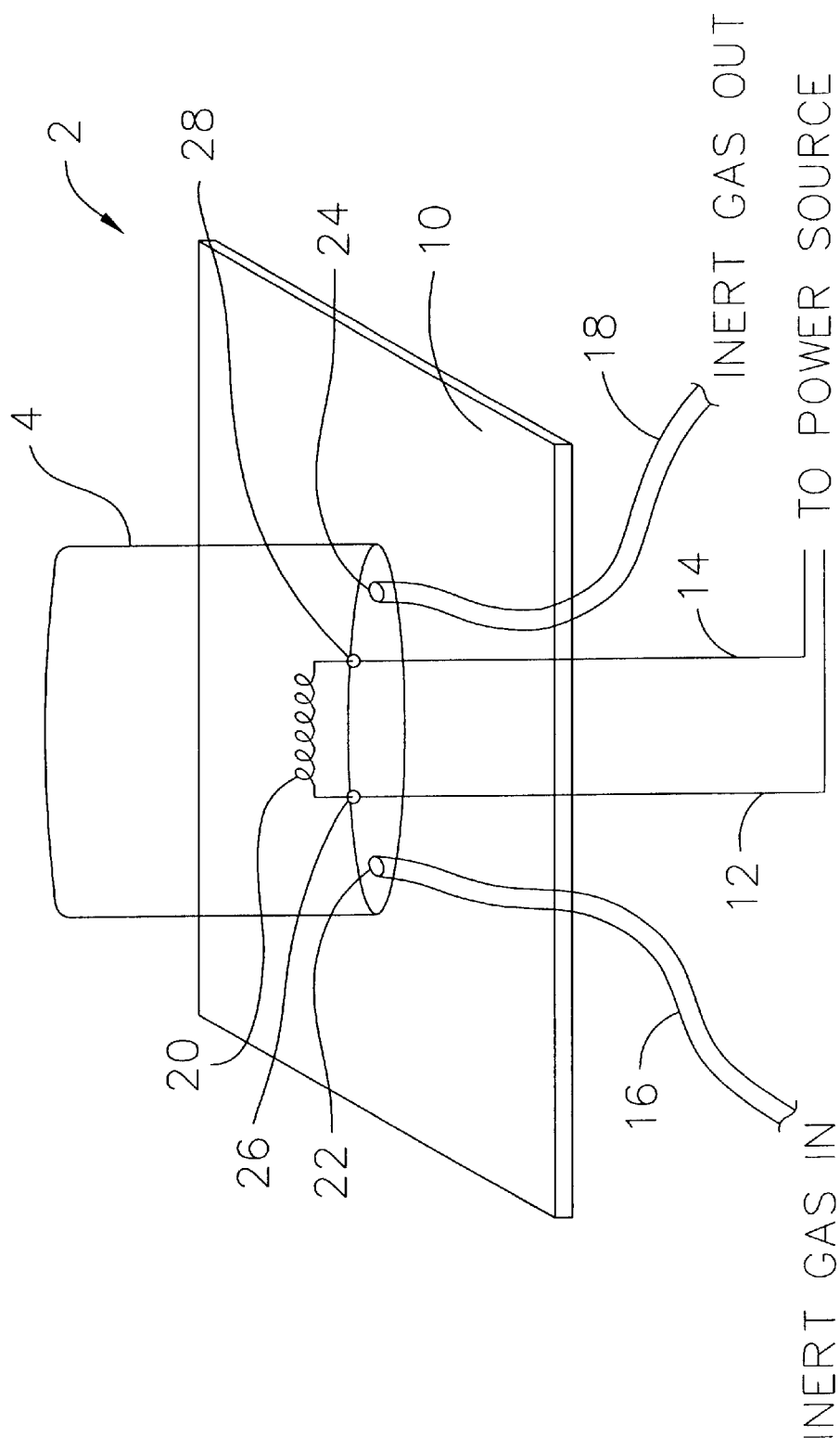
FIG. 1 is a diagram of an apparatus for annealing a tungsten dopant into the inside surface of a crucible.
Figure 2:
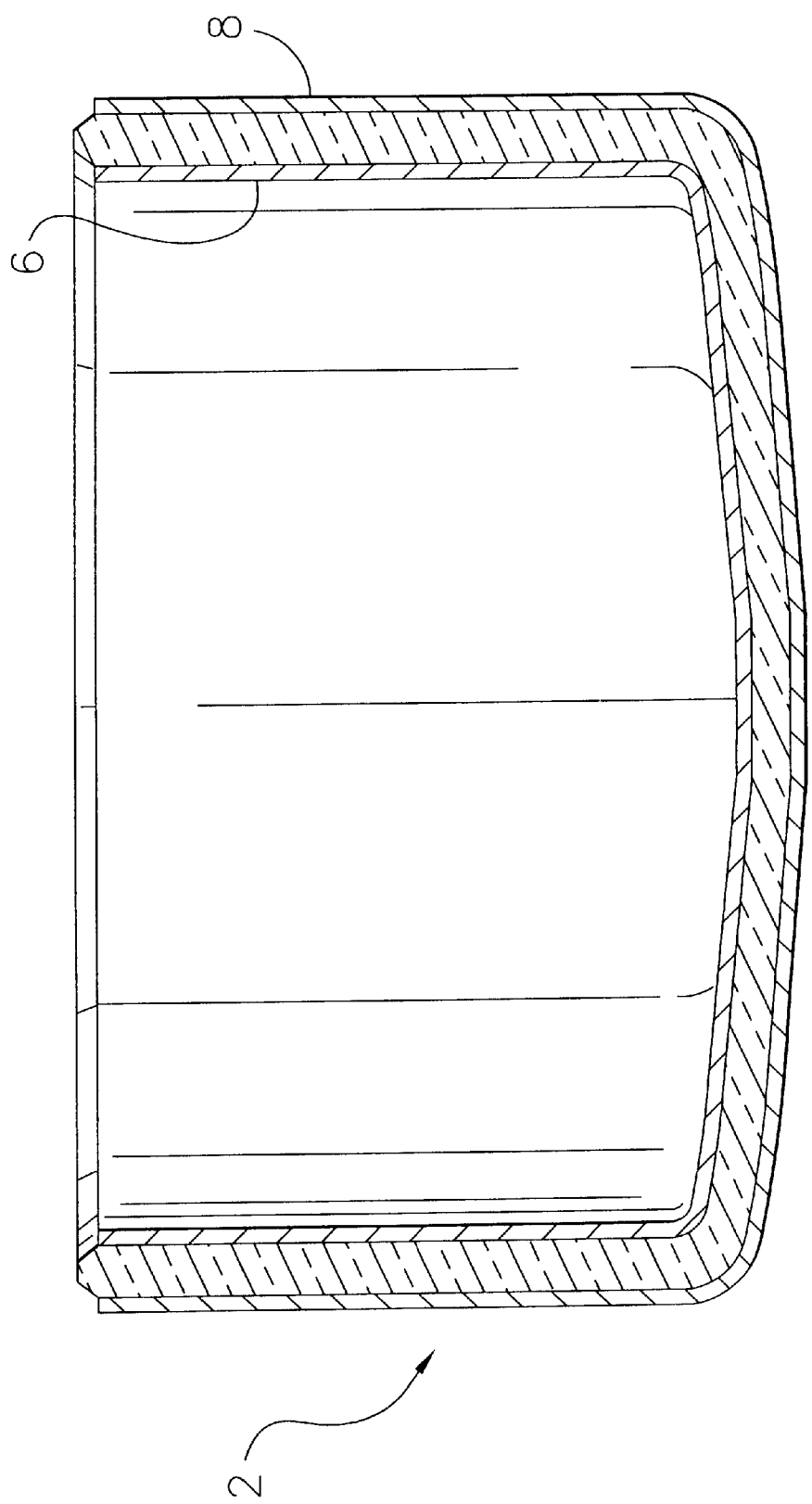
FIG. 2 is a diagram of a quartz crucible.

Referring now to FIG. 1, there is shown an apparatus 2 for annealing a tungsten dopant into the inside surface of a crucible 4 in accordance with the present invention. The crucible 4 shown in FIG. 1 is further illustrated in FIG. 2 where it is shown that the crucible 2 has an inside surface 6 and an outside surface 8. Referring again to FIG. 1, the apparatus 2 comprises a horizontal support table 10, electrical leads 12 and 14 connected to a power source (not shown), inert gas inlet line 16 connected to an inert gas source (not shown), inert gas outlet line 18, and tungsten source 20. The inert gas moves oxygen away from the tungsten source to reduce unwanted oxidation of the source and the formation of solid oxides. Suitable inert gases may include, for example, argon, helium, xenon and the like. Horizontal support table 10 supports the crucible being treated, and may be comprised of stainless steel, glass, or ceramic for example. Table 10 has holes 22 and 24 drilled into its surface to allow inert gas inlet line 16 and inert gas outlet line 18 access to the environment surrounding the crucible being treated. Also, table 10 has holes 26 and 28 drilled into its surface to allow electrical lines 12 and 14 access to tungsten source 20.

In accordance with the present invention, a tungsten vapor is created within the interior of the crucible when electrical leads 12 and 14 are energized to heat tungsten source 20. Prior to the heating of the tungsten source 20 and the production of tungsten vapor, inert gas is introduced into the environment surrounding tungsten source 20 through inert gas inlet line 16. Inert gas is continuously introduced into the environment surrounding tungsten source 20 throughout the heating of the source and the production of tungsten vapor. Inert gas is removed from the environment surrounding the tungsten source through inert gas outlet line 18. This continuous purging of the environment surrounding tungsten source 20 removes substantially all of the oxygen from the environment surrounding tungsten source 20. The flow of the purging gas should be such that it is sufficient to remove substantially all of the oxygen such that the formation of solid oxides is substantially eliminated. It should be noted that one skilled in the art would recognize that a small amount of sealant, such as vacuum grease, silicon or another suitable sealant could be utilized between the crucible and the support table to ensure that the amount of oxygen entering the environment surrounding the tungsten source is reduced. Also, a reduced pressure in place of or in combination with inert gas may be used to reduce the oxygen concentration in the area of the tungsten source.

The vaporous tungsten produced by the heated tungsten source in the substantially oxygen free environment diffuses into the inside surface of the crucible. The tungsten source is heated to an increased temperature which in turn increases the temperature on the inside surface to facilitate diffusion. The inside surface of the crucible is generally exposed to the vaporous tungsten for a period of between about 1 hour and about 10 hours, more preferably between about 2 hours and about 8 hours, still more preferably between about 4 hours and about 6 hours, and most preferably about 5 hours to create a tungsten doped layer containing no less than about 100 ppba (parts per billion atomic) tungsten, preferably no less than about 200 ppba tungsten, and most preferably no less than about 300 ppba tungsten on the inside surface of the crucible. The tungsten is diffused between about 0.1 millimeter and about 4 millimeters into the inside surface to create a tungsten doped layer on that surface having a depth equal to the depth of the diffused tungsten. Tungsten can be diffused into crucibles of all sizes to improve performance. It would be recognized by one skilled in the art that tungsten could be annealed deeper into the inside surface by annealing for a longer time period should the commercial need arise. Upon use in a crystal growing process, the tungsten doped layer behaves like, and may be, a bubble free layer.

One skilled in the art will also recognize that the annealed tungsten will not create a sharp transition from, for example 100 ppba to 0 ppba within the crucible. A gradient is created as the tungsten is annealed into the surface, and although a tungsten doped layer is created having a thickness of, for example, 4 millimeters, some tungsten diffuses beyond the 4 millimeter range into the crucible.

As used herein the term bubble free layer can mean that the layer is completely bubble free, or that it is substantially free from bubbles. Current analytical detection methods for identifying bubbles in quartz crucibles are capable of detecting bubbles having a diameter of about 15 micrometers. When tungsten is annealed into the inside surface of a crucible in accordance with the present invention to a depth of between about 0.1 millimeter and about 4 millimeters, the area containing the tungsten has 0 bubbles per cubic millimeter having a diameter at least about 15 micrometers. Similarly, after thermal cycling typical of the ingot growing process the crucible contains 0 bubbles per cubic millimeter having a diameter at least about 15 micrometers. It would be recognized by one skilled in the art that as analytical detection methods improve and bubbles having a smaller diameter can be identified, it would be preferred that the amount of tungsten annealed into the crucible surface be adjusted accordingly to achieve a level of no detectable bubbles in the tungsten doped region as discussed above.

When the crucible having the tungsten doped layer is subsequently utilized in a crystal pulling process, the crucible is slowly dissolved into the silicon melt due to the extreme conditions necessary for ingot growth. As such, the tungsten located in the quartz matrix that is dissolved into the melt enters the silicon melt. However, it has been shown that the tungsten does not enter into the growing ingot in detectable amounts. The reasons for this appear two-fold. First, because such a low amount of tungsten is required to be annealed into the crucible to achieve the desired effect, a substantial amount of tungsten is not present in the melt. Secondly, because tungsten has a low segregation coefficient, it tends to stay in the liquid silicon and not become crystalized into the growing ingot.

Without being bound to a particular theory, it is believed that the annealing of the tungsten into and below the crucible surface and into the quartz or silica matrix significantly increases the solubility of the bubble former gases within the fused quartz or silica matrix itself. This increased solubility of the bubble formers may be caused by the occurrence of a polyhedral rearrangement and subsequent change in molecular spacing that takes place during thermal treatment. Upon a subsequent heat treatment, the annealed tungsten may cause a disordered network of octahedrons to form resulting in considerable empty space in the silica matrix. This empty space may result in significant changes in the silica properties such as diffusion and the solubility of gases in silica. At a minimum, it appears that the empty spaces created by the polyhedral rearrangement have some influence on the diffusion and solubility of the gas formers that can create bubbles during a crystal growth process.

In an alternative embodiment of the present invention, tungsten can be annealed into the inside and/or the outside surfaces of a quartz crucible to create tungsten doped layers on both the inside and outside surfaces. The annealing of tungsten into the outside surface of a crucible to create a tungsten doped layer may increase the mechanical strength of the crucible to reduce deformation of the crucible during ingot growth. Additionally, a tungsten doped layer on the outside surface reduces the reactivity of the crucible with the graphite support structure supporting the crucible and therefore decreases the amount of contaminates surrounding the growing ingot and silicon melt.

Figure 3:
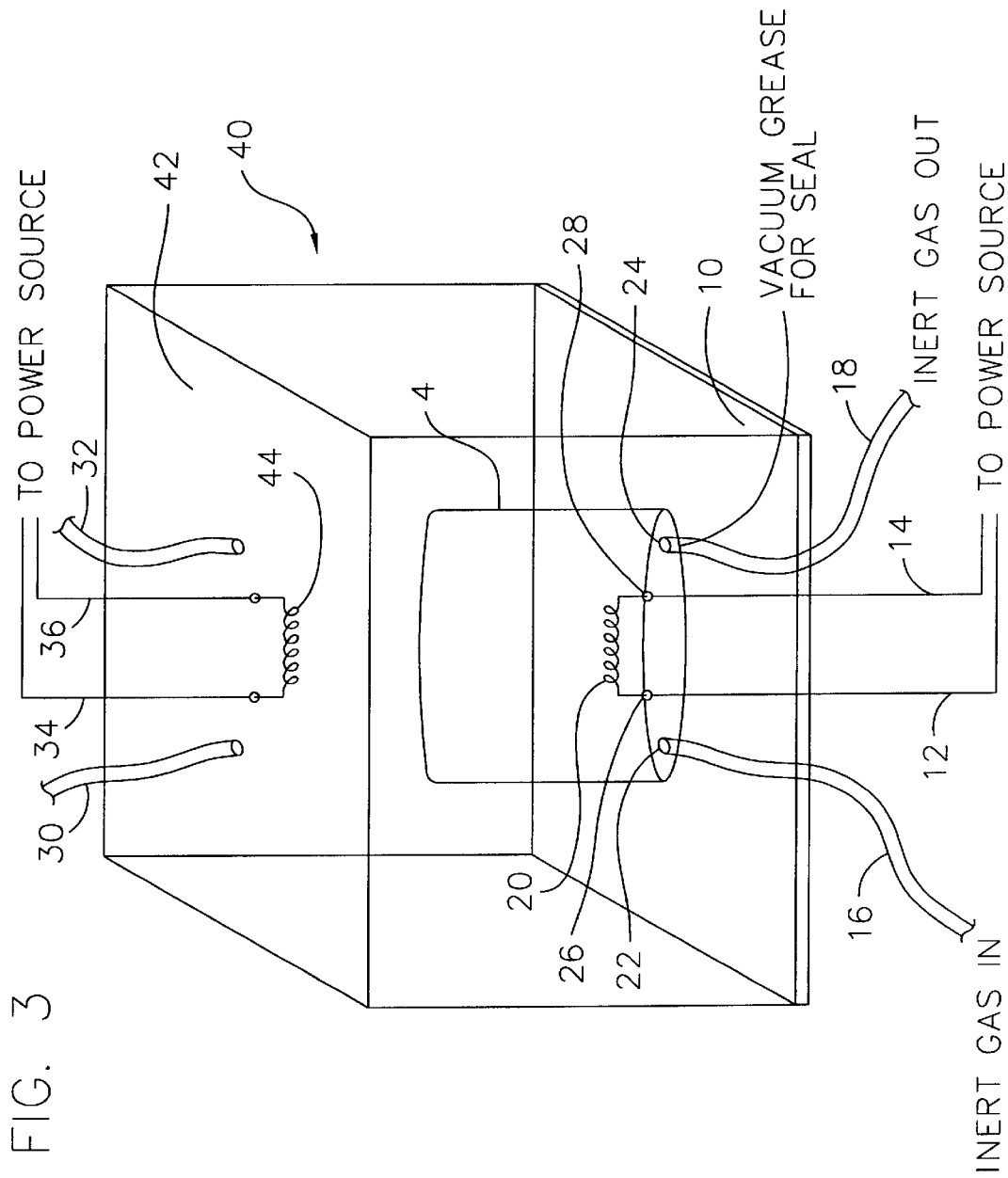
FIG. 3 is a diagram of an apparatus for annealing a tungsten dopant into the inside and/or outside surfaces of a crucible.

Referring now to FIG. 3, there is shown an apparatus 40 for annealing tungsten into the inside and/or the outside surfaces of a quartz crucible. In addition to the components illustrated in the apparatus for annealing tungsten into the inside surface of a quartz crucible shown in FIG. 1, the apparatus 40 comprises a vessel 42, a second tungsten element 44, a second inert gas inlet line 30, a second inert gas outlet line 32, and a second set of power leads 34 and 36 connected to a power supply (not shown.) The vessel 42 may be comprised of glass, stainless steel, or ceramic for example, and should mate closely to horizontal support surface 10 to ensure a tight seal to keep oxygen from entering the inert gas purged area. The second tungsten source 44 is similar to the tungsten source described above, and the inert gas inlet and outlet lines, 30 and 32 respectively, purge the vessel during annealing.

The inside and outside surfaces of a quartz crucible can be treated with the apparatus shown in FIG. 3 such that tungsten is annealed into both surfaces to create tungsten doped layers. The inside surface of the crucible is treated as described above such that tungsten source 20 is energized to anneal tungsten into the inside surface of the crucible to the desired depth. Tungsten source 44 is also energized to anneal tungsten into the outside surface of the crucible. The areas surrounding both tungsten sources are continuously purged with inert gas during the heating of the source to minimize the presence of oxygen and reduce the potential of source oxidation and the formation of solid oxides.

To anneal the tungsten into the outside surface of the crucible, the second tungsten source is energized and heated. The outside surface of the crucible is generally exposed to the vaporous tungsten for a period of between about 1 hour and about 10 hours, more preferably between about 2 hours and about 8 hours, still more preferably between about 4 hours and about 6 hours, and most preferably about 5 hours to create a tungsten doped layer containing no less that about 100 ppba tungsten, preferably no less than about 200 ppba tungsten, and most preferably no less than about 300 ppba tungsten into the outside surface of the crucible. The tungsten is diffused between about 0.1 millimeter and about 6 millimeters into the outside surface to create a tungsten doped layer on that surface having a depth equal to the depth of the diffused tungsten. The area containing the tungsten has 0 bubbles per cubic millimeter having a diameter at least about 15 micrometers.

It should be realized by one skilled in the art that the outside surface only of a crucible could be treated to create a crucible having tungsten annealed into the outside surface only. This creation of a tungsten doped layer on the outside surface only can be accomplished utilizing the apparatus set forth in FIG. 3 by simply energizing the second source for the desired time period. In this embodiment, only the outside surface is annealed as the tungsten source for treating the inside surface is not energized.

In an alternative embodiment of the present invention tungsten may be annealed into the inside surface, outside surface, or both the inside and outside surfaces of a quartz crucible through the use of a metallo-organic compound containing tungsten. In this embodiment, the metallo-organic compound is a solution of a tungsten compound in an organic solvent. The compound is applied to the inside surface, outside surface, or both the inside and the outside surfaces of the crucible to a thickness of between about 500 and about 2000 Angstroms, and allowed to dry. Subsequently, a layer of silica is applied to the treated crucible utilizing a silica gel, which dries to form a silica layer. Silica gel layering may be repeated to form several layers. The crucible is then annealed at a temperature of between about 550° C. and about 900° C. for a period of between about 1 and about 10 hours to interdiffuse the two layers such that the physical structure of the silica matrix is altered resulting in the collapse of bubbles due to the increased gas solubility as described above. During the annealing at least about 100 ppba of tungsten is diffused into the crucible surface and the organic components are vaporized.

In an alternative embodiment to the layering steps described above, intermixing of the silica and tungsten components using suitable precursor solutions such as tungsten isopropoxide and tetra ethyl orthosilicate may be used. The intermixed components are subsequently heated as described above to vaporize the organic components and anneal the tungsten to result in the desired physical effect after annealing. Additionally, arc fusing a mixture of tungsten and quartz sand such that the tungsten can remain in the silica matrix may be used in accordance with the present invention. Suitable tungsten sources for arc fusing may include oxides of tungsten.

In view of the above, it will be seen that the several objects of the invention are achieved.

As various changes could be made in the above-described tungsten doping process without departing from the scope of the invention, it is intended that all matter contained in the above description be interpreted as illustrative and not in a limiting sense.

What is claimed is:

1. A process for preparing a quartz crucible having a tungsten doped layer, the crucible having an inside surface and an outside surface, the process comprising depositing tungsten on a surface of the crucible and diffusing the tungsten into the surface of the crucible.

2. A process as set forth in claim 1 wherein the tungsten is deposited and diffused on the inside surface of the crucible.

3. A process as set forth in claim 1 wherein the tungsten is deposited and diffused on the inside surface of the crucible to create a tungsten doped layer having a concentration of at least about 100 ppba of tungsten and a thickness of between about 0.1 millimeter and about 4 millimeters.

4. A process as set forth in claim 1 wherein the tungsten is deposited and diffused on the inside surface of the crucible to create a tungsten doped layer having a concentration of at least about 200 ppba of tungsten and a thickness of between about 0.1 millimeter and about 4 millimeters.

5. A process as set forth in claim 1 wherein the tungsten is deposited and diffused on the inside surface of the crucible to create a tungsten doped layer having a concentration of at least about 300 ppba of tungsten and a thickness of between about 0.1 millimeter and about 4 millimeters.

6. A process as set forth in claim 1 wherein the tungsten is deposited and diffused on the inside surface of the crucible to create a tungsten doped layer having a thickness of between 0.1 millimeter and about 4 millimeters such that the area containing the tungsten is free from bubbles having a diameter of at least about 15 micrometers.

7. A process as set forth in claim 1 wherein the tungsten is deposited and annealed on the inside surface of the crucible for a period of between about 1 hour and about 10 hours to diffuse no less than about 100 ppba of tungsten between about 0.1 millimeter and about 4 millimeters into the inside surface of the crucible.

8. A process as set forth in claim 1 wherein the tungsten is deposited and diffused on the outside surface of the crucible.

9. A process as set forth in claim 1 wherein the tungsten is deposited and diffused on the outside surface of the crucible to create a tungsten doped layer having a concentration of at least about 100 ppba of tungsten and a thickness of between about 0.1 millimeter and about 6 millimeters.

10. A process as set forth in claim 1 wherein the tungsten is deposited and diffused on the outside surface of the crucible to create a tungsten doped layer having a concentration of at least about 200 ppba of tungsten and a thickness of between about 0.1 millimeter and about 6 millimeters.

11. A process as set forth in claim 1 wherein the tungsten is deposited and diffused on the outside surface of the crucible to create a tungsten doped layer having a concentration of at least about 300 ppba of tungsten and a thickness of between about 0.1 millimeter and about 6 millimeters.

12. A process as set forth in claim 1 wherein the tungsten is deposited and diffused on the outside surface of the crucible to create a tungsten doped layer having a thickness of between 0.1 millimeter and about 6 millimeters such that the area containing the tungsten is free from bubbles having a diameter of at least about 15 micrometers.

13. A process as set forth in claim 1 wherein the tungsten is deposited and annealed on the outside surface of the crucible for a period of between about 1 hour and about 10 hours to diffuse no less than about 100 ppba of tungsten between about 0.1 millimeter and about 6 millimeters into the outside surface of the crucible.

14. A process for preparing a quartz crucible having two tungsten doped layers, the crucible having an inside surface and an outside surface, the process comprising:
   depositing tungsten on the inside surface of the crucible and diffusing the tungsten into the inside surface; and
   depositing tungsten on the outside surface of the crucible and diffusing the tungsten into the outside surface.

15. A process as set forth in claim 14 wherein tungsten is deposited and diffused on the inside surface of the crucible to create a tungsten doped layer having a concentration of no less than about 100 ppba of tungsten and a thickness of about 0.1 millimeter and about 4 millimeters on the inside surface of the crucible and tungsten is deposited and diffused on the outside surface of the crucible to create a tungsten doped layer having a concentration of no less than about 100 ppba of tungsten and a thickness of about 0.1 millimeter and about 6 millimeters on the outside surface of the crucible.

16. A process for preparing a quartz crucible having a tungsten doped layer on an inside surface, the crucible having an inside surface and an outside surface, the process comprising:

energizing a tungsten source to heat the source and produce a heated vapor comprising tungsten, the source being energized within the crucible, the environment defined by the interior of the crucible; and exposing the inside surface of the crucible to the heated tungsten vapor to diffuse tungsten into the surface of the crucible.

17. A process for preparing a quartz crucible having a tungsten doped layer, the crucible having an inside and an outside surface, the process comprising:

applying a layer of a tungsten-containing compound to a surface of the crucible;

drying the compound on the crucible surface;

applying a layer of silica onto the coated surface; and annealing the crucible at a temperature of between about 550° C. and about 900° C. to interdiffuse the compound and silica layer and create a layer containing at least about 100 ppba of tungsten in the crucible.

18. A process as set forth in claim 17 wherein the compound is between about 500 and about 2000 Angstroms thick on the crucible surface.

19. A process as set forth in claim 17 wherein the layers are applied on the inside surface of the crucible.

20. A process as set forth in claim 17 wherein the layers are applied on the outside surface of the crucible.

21. A process as set forth in claim 17 wherein the layers are applied to both the inside and the outside surfaces of the crucible.

22. A process for preparing a quartz crucible having a tungsten doped layer, the crucible having an inside and an outside surface, the process comprising:

mixing a tungsten-containing compound and a silica containing gel;

applying the mixture to a surface of the crucible;

allowing the mixture to dry on the surface; and annealing the crucible at a temperature of between about 550° C. and about 900° C. to create a layer having at least about 100 ppba of tungsten in the crucible.

23. A process as set forth in claim 22 wherein the tungsten-containing compound is tungsten isopropoxide and the silica containing gel is tetra ethyl orthosilicate.

24. A process as set forth in claim 22 wherein the mixture is applied on the inside surface of the crucible.

25. A process as set forth in claim 22 wherein the mixture is applied on the outside surface of the crucible.

26. A process as set forth in claim 22 wherein the mixture is applied to both the inside and the outside surfaces of the crucible.

27. A crucible having a tungsten doped layer on an inside surface, the tungsten doped layer on the inside surface having a concentration of no less than about 100 ppba tungsten and a thickness of between about 0.1 millimeter and about 4 millimeters.

28. A crucible as set forth in claim 27 wherein the tungsten doped layer is free from bubbles having a diameter of at least about 15 micrometers.

29. A crucible having a tungsten doped layer on an outside surface, the tungsten doped layer on the outside surface having a concentration of no less than about 100 ppba tungsten and a thickness of between about 0.1 millimeter and about 6 millimeters.

30. A crucible as set forth in claim 29 wherein the tungsten doped layer contains no bubbles having a diameter of at least about 15 micrometers.

31. A crucible having a tungsten doped layer on an inside surface and a tungsten doped layer on an outside surface, the tungsten doped layer on the inside surface having a concentration of no less than about 100 ppba tungsten and a thickness of between about 0.1 millimeter and about 4 millimeters and the tungsten doped layer on the outside surface having a concentration of no less than about 100 ppba tungsten and a thickness of between about 0.1 millimeter and about 6 millimeters.

32. A crucible containing a tungsten dopant, the crucible having an inside surface, an outside surface, and a central plane equidistant between the inside surface and the outside surface, the tungsten dopant being distributed between the inside surface and the central plane such that the density of the tungsten dopant decreases from the inside surface toward the central plane to create a region between about 0.1 and about 4 millimeters thick having a tungsten concentration of at least about 100 ppba and the tungsten dopant being distributed between the outside surface and the central plane such that the density of the tungsten dopant decreases from the outside surface toward the central plane to create a region between about 0.1 and about 6 millimeters thick having a tungsten concentration of at least about 100 ppba.

33. A crucible for holding a charge of molten silicon, the crucible comprising a tungsten doped layer with the layer having a concentration of at least about 100 ppba tungsten and a thickness of at least about 0.1 millimeters.

34. A crucible as set forth in claim 33 wherein the layer is on the inside surface and has a thickness of between about 0.1 and about 4 millimeters.

35. A crucible as set forth in claim 33 wherein the layer is on the outside surface and has a thickness of between about 0.1 and about 6 millimeters.

36. An apparatus for diffusing tungsten into a surface of a quartz crucible to create a tungsten doped layer, the quartz crucible having an inside surface and an outside surface, the apparatus comprising:

a horizontal support for supporting the quartz crucible, the quartz crucible being positioned on the horizontal support such that the open end of the crucible is in contact with the horizontal support;

a tungsten source extending through the horizontal support and into the interior of the supported crucible;

a power source for energizing and heating the tungsten source to produce a heated vapor comprising tungsten;

a gas inlet located in the horizontal support positioned to introduce a purging gas into the supported crucible to purge oxygen from the interior of the supported crucible; and a gas outlet located in the horizontal support positioned to remove the purging gas from the interior of the supported crucible.

37. An apparatus as set forth in claim 36 further comprising:

a vessel surrounding the supported crucible;

a second tungsten source extending through the vessel;

a second power source for energizing and heating the second tungsten source to produce a heated vapor comprising tungsten;

a gas inlet located in the vessel positioned to introduce a purging gas into the environment surrounding supported crucible within the vessel to purge oxygen from the interior of the vessel; and a gas outlet located in the vessel positioned to remove the purging gas from the interior of the vessel.

* * * * *